United States Patent
Itonaga et al.

(10) Patent No.: US 11,581,699 B2
(45) Date of Patent: Feb. 14, 2023

(54) SEMICONDUCTOR DEVICE AND METHOD OF MANUFACTURING THE SEMICONDUCTOR DEVICE

(71) Applicant: NICHIA CORPORATION, Anan (JP)

(72) Inventors: Shohei Itonaga, Komatsushima (JP); Eiichiro Okahisa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 96 days.

(21) Appl. No.: 17/319,678

(22) Filed: May 13, 2021

(65) Prior Publication Data

US 2021/0265808 A1    Aug. 26, 2021

Related U.S. Application Data

(62) Division of application No. 16/440,821, filed on Jun. 13, 2019, now Pat. No. 11,038,317.

(30) Foreign Application Priority Data

Jun. 14, 2018   (JP) .............................. JP2018-113728

(51) Int. Cl.
*H01S 5/022*   (2021.01)
*H01S 5/0237*   (2021.01)
(Continued)

(52) U.S. Cl.
CPC .......... *H01S 5/0237* (2021.01); *B23K 1/0016* (2013.01); *B41M 3/006* (2013.01); *H01S 5/02216* (2013.01); *B23K 2101/40* (2018.08)

(58) Field of Classification Search
CPC ............... H01S 5/02216; H01S 5/0237; H01S 5/02469; H01S 5/02272; B41M 3/006; B23K 1/0016; B23K 210/40
See application file for complete search history.

(56) References Cited

U.S. PATENT DOCUMENTS

2012/0112622 A1   5/2012  Suzuki et al.
2013/0107523 A1   5/2013  Takeda
(Continued)

FOREIGN PATENT DOCUMENTS

JP    H10-256719 A    9/1998
JP    2009-105343 A    5/2009
(Continued)

OTHER PUBLICATIONS

Non-Final Office Action on U.S. Appl. No. 16/440,821 dated Sep. 11, 2020.
(Continued)

*Primary Examiner* — Michael Carter
(74) *Attorney, Agent, or Firm* — Foley & Lardner LLP

(57) ABSTRACT

A semiconductor device includes: a package including: a lower surface, at least one first metal surface at an outer periphery of the lower surface, and at least one second metal surface at the lower surface at a location different from the at least one first metal surface; a mounting substrate disposed below the package and including: an upper surface, at least one first metal pattern disposed at the upper surface below the at least one first metal surface, and at least one second metal pattern disposed at the upper surface below the at least one second metal surface; a first bonding member containing a metal material and bonding the at least one first metal surface and the at least one first metal pattern; and a second bonding member containing a metal material and bonding the at least one second metal surface and the at least one second metal pattern.

14 Claims, 9 Drawing Sheets

(51) Int. Cl.
    *B41M 3/00*     (2006.01)
    *B23K 1/00*     (2006.01)
    *H01S 5/02216*     (2021.01)
    *B23K 101/40*     (2006.01)

(56) References Cited

U.S. PATENT DOCUMENTS

| | | |
|---|---|---|
| 2015/0075676 A1 | 3/2015 | Funakoshi et al. |
| 2017/0355042 A1 | 12/2017 | Kakuishi et al. |
| 2017/0358397 A1 | 12/2017 | McConnell et al. |

FOREIGN PATENT DOCUMENTS

| | | | |
|---|---|---|---|
| JP | 2009105343 | * | 5/2009 |
| JP | 2009-130147 A | | 6/2009 |
| JP | 2011-023484 A | | 2/2011 |
| JP | 2011-210974 A | | 10/2011 |
| JP | 6061248 B2 | | 1/2017 |

OTHER PUBLICATIONS

Notice of Allowance on U.S. Appl. No. 16/440,821 dated Feb. 22, 2021.

* cited by examiner

SEMICONDUCTOR DEVICE AND METHOD OF MANUFACTURING THE SEMICONDUCTOR DEVICE

CROSS-REFERENCE TO RELATED PATENT APPLICATIONS

The present application is a divisional of U.S. patent application Ser. No. 16/440,821, filed on Jun. 13, 2019, which claims priority to Japanese Patent Application No. 2018-113728, filed on Jun. 14, 2018, the contents of which are hereby incorporated by reference in their entireties.

BACKGROUND

The present disclosure relates to a semiconductor device and a method of manufacturing the semiconductor device.

Japanese Patent Publication No. 2009-130147A describes a method of mounting in which a chip-shaped electronic component is soldered on a mounting substrate. In Japanese Patent Publication No. 2009-130147A, the chip-shaped electronic component is disposed on the mounting substrate via solder pastes, and the solder pastes are melted. Due to surface tension of the melted solders, the chip-shaped electronic component is self-aligned to be soldered with high precision in alignment. In Japanese Patent Publication No. 2009-130147A, fillets formed by the melted solders cause self-alignment in good balance, aligning the chip-shaped electronic component with respect to the mounting substrate.

SUMMARY

Such formation of fillets has merit in that quality of bonding state of the solders can be easily evaluated by an external appearance inspection. Meanwhile, in self-alignment using solders, alignment is performed according to a metal pattern of an electronic component and a metal pattern of a mounting substrate, and it is difficult to perform alignment irrespective of the shapes of the metal patterns.

According to one embodiment of the present invention, a method of manufacturing a semiconductor device includes: providing a package, a mounting substrate, at least one first bonding member, and at least one second bonding member, in which the package includes a lower surface, at least one first metal surface at an outer periphery of the lower surface, and at least one second metal surface at the lower surface at a location different from the at least one first metal surface, the mounting substrate is located below the package, has an upper surface, and includes: at least one first metal pattern that is disposed at the upper surface below the at least one first metal surface, and at least one second metal pattern that is disposed at the upper surface below the at least one second metal surface, the at least one first bonding member contains a metal material, and is disposed at a position connecting the at least one first metal surface and the at least one first metal pattern, and the at least one second bonding member contains a metal material, and is disposed at a position connecting the at least one second metal surface and the at least one second metal pattern; heating the at least one first bonding member and the at least one second bonding member at a temperature equal to or higher than both a bonding temperature of the at least one first bonding member and a bonding temperature of the at least one second bonding member, to bond the package and the mounting substrate together via the at least one first bonding member and the at least one second bonding member; wherein a shape change ratio of the at least one second bonding member between before and after the heating is smaller than a shape change ratio of the at least one first bonding member between before and after the heating.

According to another embodiment of the present invention, a method of manufacturing a semiconductor device includes: providing a package, a mounting substrate, at least one first bonding member, and at least one second bonding member, in which the package includes a lower surface, at least one first metal surface at an outer periphery of the lower surface, and at least one second metal surface at the lower surface at a location different from the at least one first metal surface, the mounting substrate is located below the package, has an upper surface, and includes: at least one first metal pattern that is disposed at the upper surface below the at least one first metal surface, and at least one second metal pattern that is disposed at the upper surface below the at least one second metal surface, the at least one first bonding member contains a metal material, and is disposed at a position connecting the at least one first metal surface and the at least one first metal pattern, and the at least one second bonding member contains a metal material, and is disposed at a position connecting the at least one second metal surface and the at least one second metal pattern; heating the at least one first bonding member and the at least one second bonding member at a temperature equal to or higher than both a bonding temperature of the at least one first bonding member and a bonding temperature of the at least one second bonding member, to bond the package and the mounting substrate together via the at least one first bonding member and the at least one second bonding member; wherein, in the heating, the at least one first bonding member forms a fillet, and the at least one second bonding member is transient-liquid-phase-sintered.

According to another embodiment of the present invention, a method of manufacturing a semiconductor device includes: providing a package, a mounting substrate, at least one first bonding member, and at least one second bonding member, in which the package includes a lower surface, at least one first metal surface at outer periphery of the lower surface, and at least one second metal surface at the lower surface at a location different from the at least one first metal surface, the mounting substrate is located below the package, has an upper surface, and includes: at least one first metal pattern that is disposed at the upper surface below the at least one first metal surface, and at least one second metal pattern that is disposed at the upper surface below the at least one second metal surface, the at least one first bonding member contains a metal material, and is disposed at a position connecting the at least one first metal surface and the at least one first metal pattern, and the at least one second bonding member contains a metal material, and is disposed at a position connecting the at least one second metal surface and the at least one second metal pattern; heating the at least one first bonding member and the at least one second bonding member at a temperature equal to or higher than both a bonding temperature of the at least one first bonding member and a bonding temperature of the at least one second bonding member, to bond the package and the mounting substrate together via the at least one first bonding member and the at least one second bonding member; wherein, in the providing, the at least one second bonding member contains an organic solvent and metal particles contained in the organic solvent, and in the heating, the at least one first bonding member forms a fillet, and the organic solvent in the at least one second bonding member is evaporated.

According to another embodiment, a semiconductor device includes: a package including: a lower surface, at least one first metal surface at an outer periphery of the lower surface, and at least one second metal surface at the lower surface at a location different from the at least one first metal surface; a mounting substrate disposed below the package and including: an upper surface, at least one first metal pattern disposed at the upper surface below the at least one first metal surface, and at least one second metal pattern disposed at the upper surface below the at least one second metal surface; at least one first bonding member containing a metal material and bonding the at least one first metal surface and the at least one first metal pattern; and at least one second bonding member containing a metal material and bonding the at least one second metal surface and the at least one second metal pattern; wherein the at least one first bonding member forms a fillet connecting at least an outer periphery of the at least one first metal surface and an outer periphery of the at least one first metal pattern, and the at least one second bonding member has a shape different from the at least one first bonding member, and includes a main portion having an area smaller than an area of the at least one second metal pattern in a top view and a wet-spread portion spreading from the main portion toward an outer periphery of the at least one second metal pattern.

According to the methods described above, observation of a bonding state can be performed, and also alignment between a package and a mounting substrate can be performed irrespective of shapes of metal surfaces or the like. Further, a semiconductor device in which a bonding state can be observed and a package and a mounting substrate are aligned irrespective of shapes of metal surfaces or the like can be obtained.

DETAILED DESCRIPTION

Figure 1:
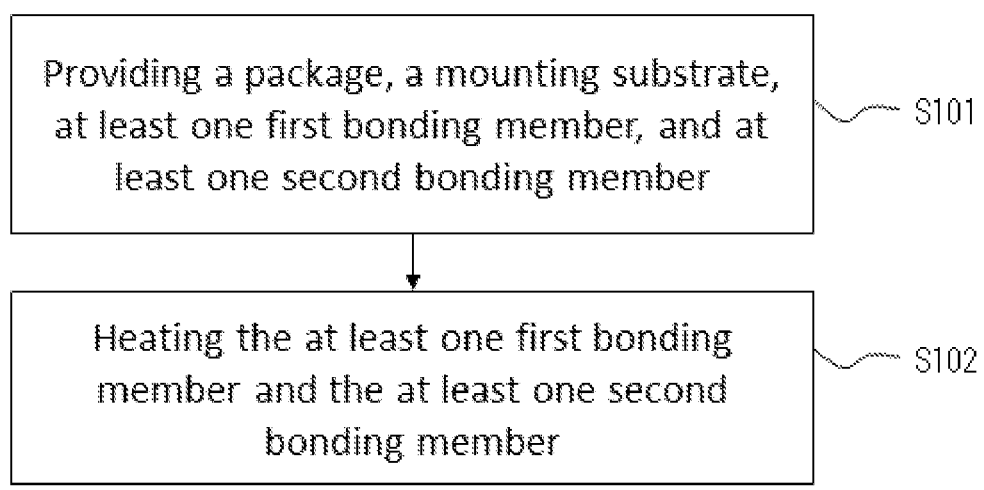
FIG. 1 is a flowchart schematically showing the flow of operations in manufacturing of a semiconductor device according to a first embodiment.

Certain embodiments of the present invention will be described below with reference to the drawings. The embodiments described below are intended as illustrative, to give a concrete form to technical ideas of the present invention, and the scope of the invention is not limited to the embodiments described below. In the description below, the same designations or the same reference numerals denote the same or like members, and duplicative descriptions will be appropriately omitted.

FIG. 1 is a flowchart schematically showing the flow of operations in manufacturing of a semiconductor device according to a first embodiment. As shown in FIG. 1, a method of manufacturing a semiconductor device according to the first embodiment includes a step S101 of providing, a step S102 of heating. Using both at least one first bonding member and at least one second bonding member, which are different types of bonding members, allows for manufacturing a semiconductor device in which a bonding state can be observed and alignment can be performed irrespective of shapes of metal surfaces or the like. That is, using the at least one first bonding member allows for observing bonding state, and using the at least one second bonding member in addition to the at least one first bonding member allows for reducing self-alignment effect compared to the case of using only the at least one first bonding member. Steps and components will be described below.

Step S101 of Providing

Figure 2A:
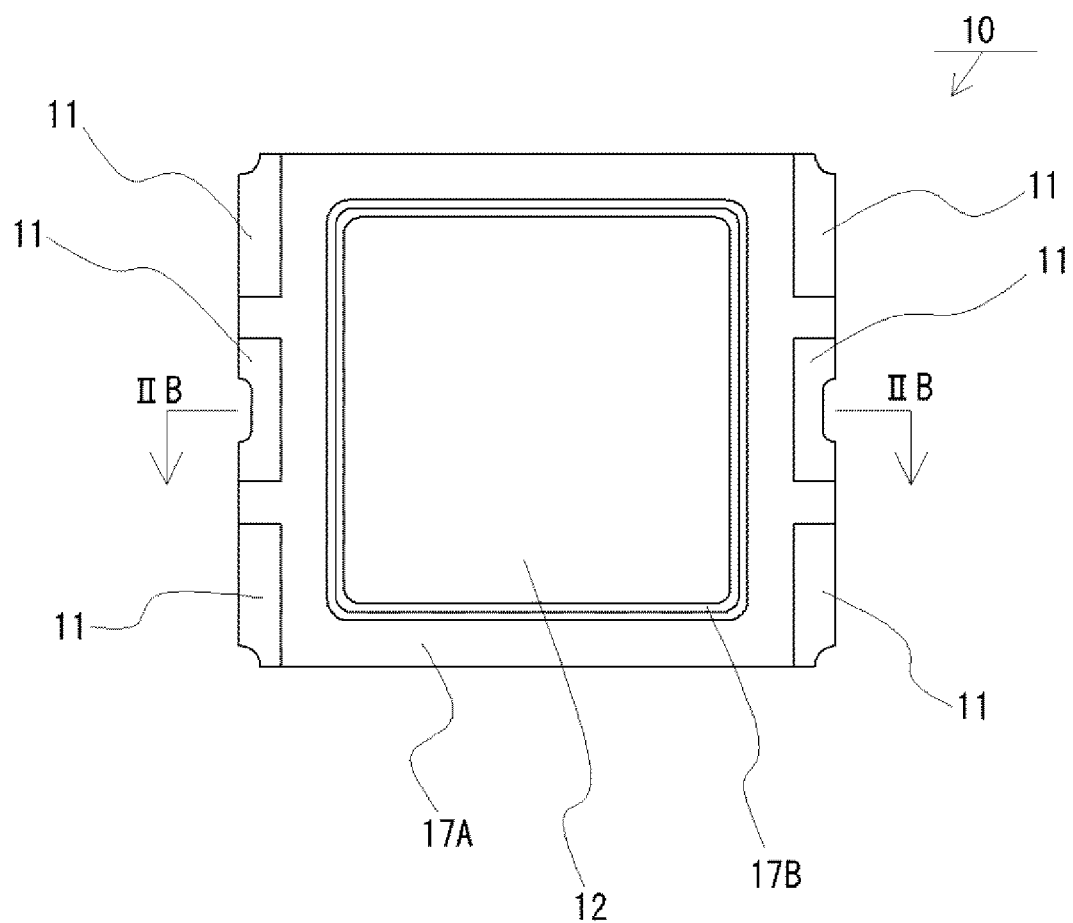
FIG. 2A is a schematic bottom view of a package according to the first embodiment.
Figure 2B:
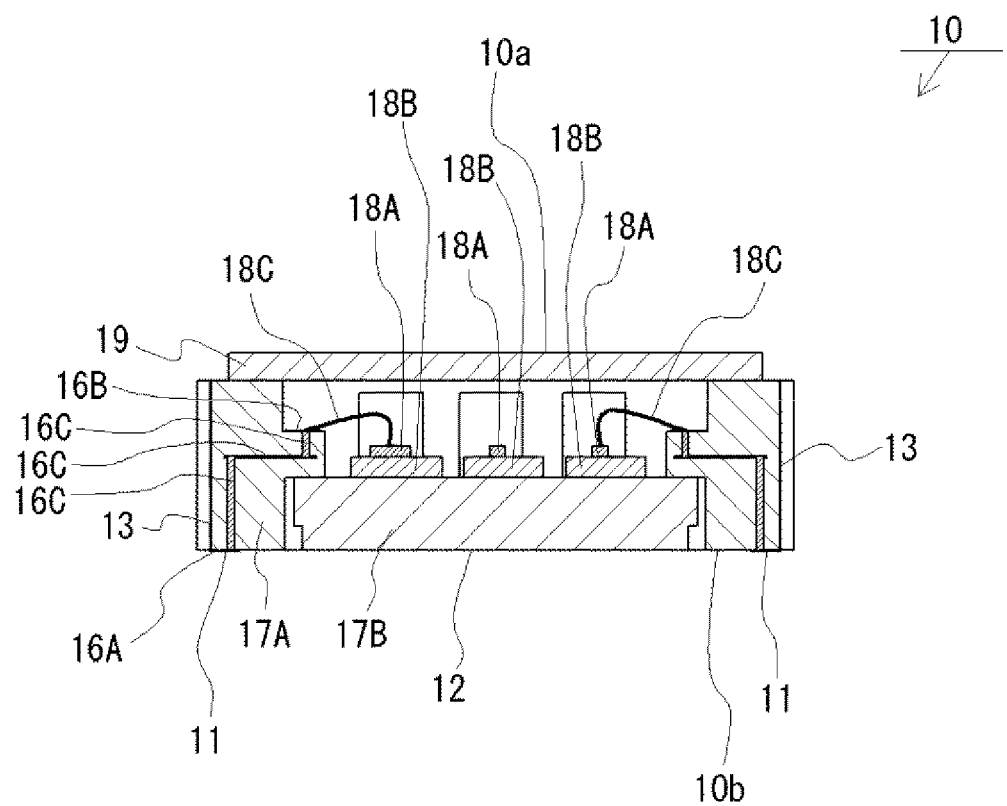
FIG. 2B is a schematic cross-sectional view taken along a line IIB-IIB in FIG. 2A.
Figure 2C:
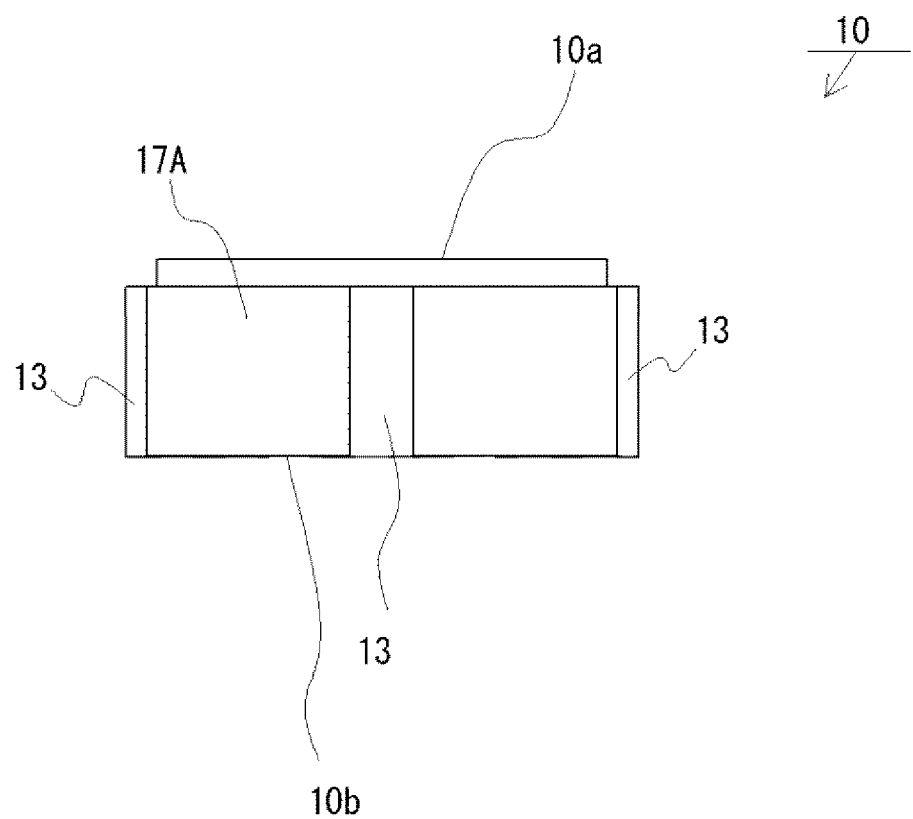
FIG. 2C is a schematic side view of the package.
Figure 3A:
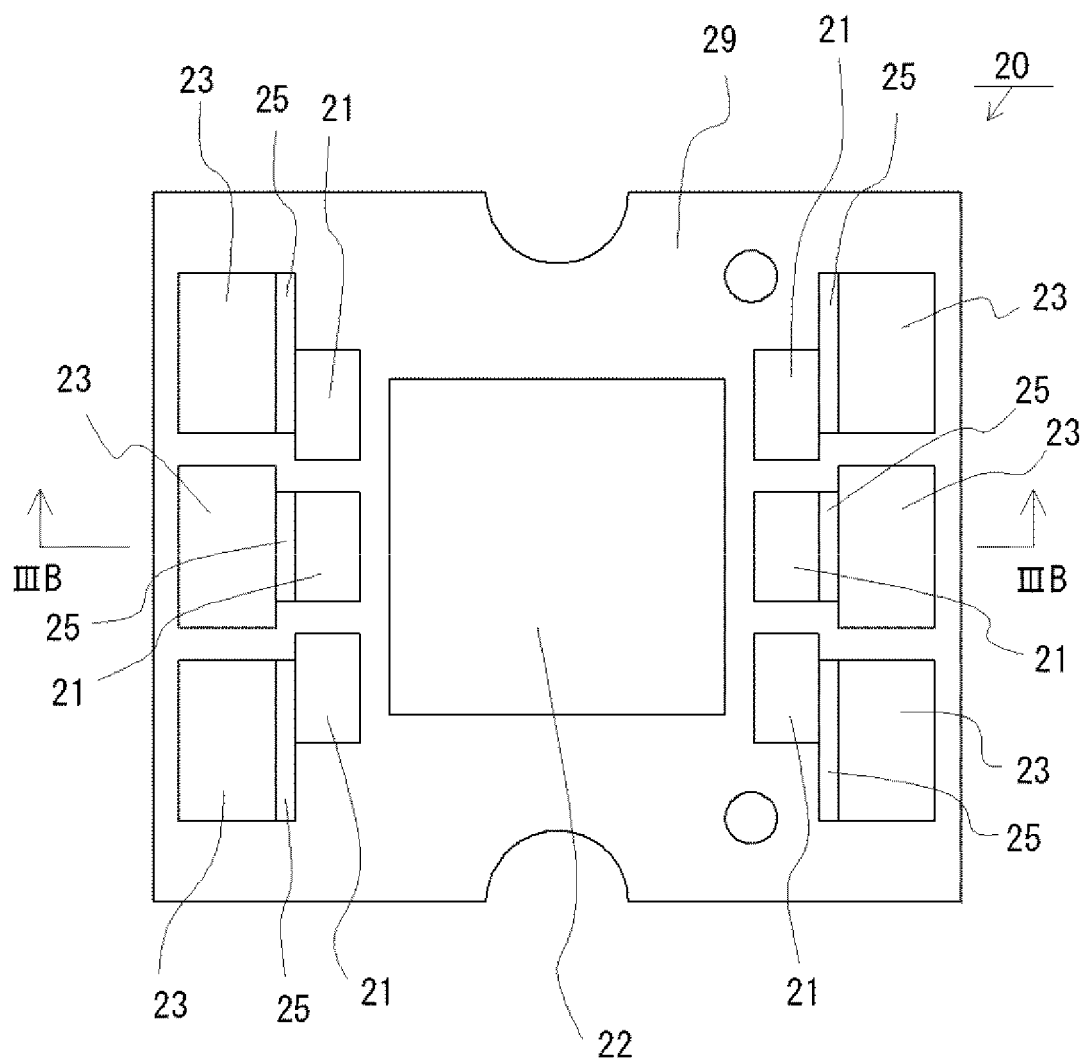
FIG. 3A is a schematic plan view of a mounting substrate according to the first embodiment.
Figure 3B:
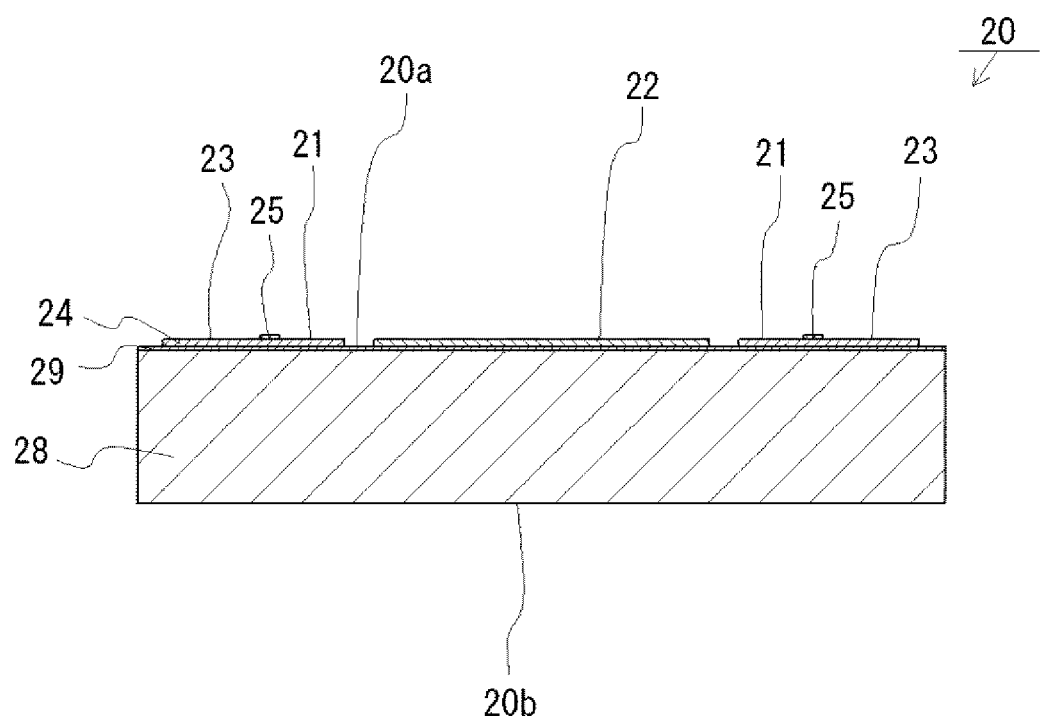
FIG. 3B is a schematic cross-sectional view taken along a line IIIB-IIIB in FIG. 3A.
Figure 4:
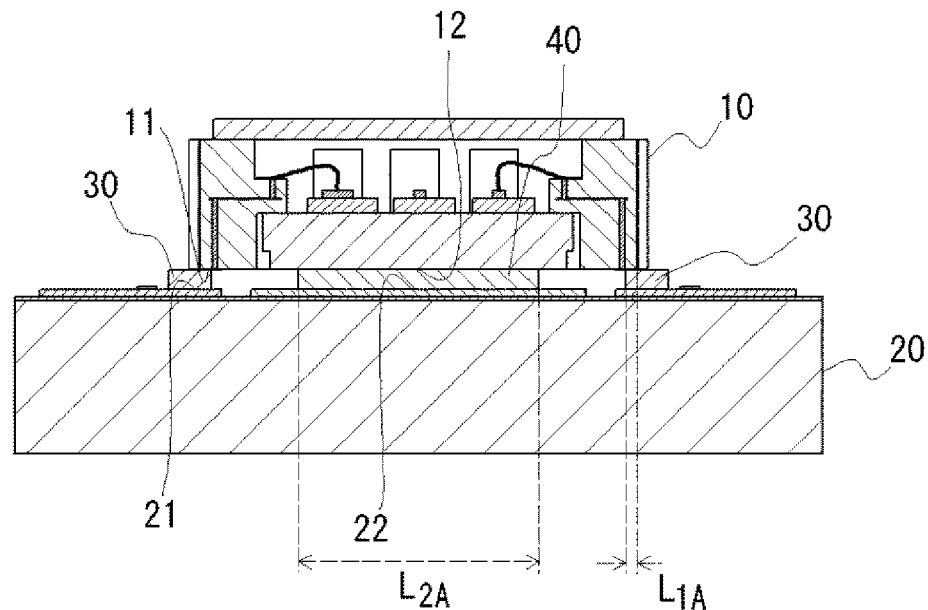
FIG. 4 is a schematic cross-sectional view of a state in which the package is disposed on the mounting substrate.

As shown in FIG. 2A to FIG. 4, a package 10, a mounting substrate 20, at least one first bonding member 30, and at least one second bonding member 40 are provided. FIG. 2A is a schematic bottom view of a lower surface 10*b* of the package 10. FIG. 2B is a schematic cross-sectional view taken along a line IIB-IIB in FIG. 2A. FIG. 2C is a schematic side view of the package 10. FIG. 3A is a schematic plan view of the mounting substrate 20. FIG. 3B is a schematic cross-sectional view taken along a line IIIB-IIIB in FIG. 3A. FIG. 4 is a schematic cross-sectional view of a state in which the package 10 is disposed on the mounting substrate 20.

As shown in FIG. 2A and FIG. 2B, the package 10 includes an upper surface 10*a* and the lower surface 10*b*. The package 10 includes at least one first metal surface 11 at the lower surface 10*b* at an outer periphery of the lower surface 10*b*, and at least one second metal surface 12 at the lower surface 10*b* at a position different from the at least one first metal surface 11. The expression "near an outer periphery of the lower surface 10*b*," where the at least one first metal surface 11 is disposed, refers to a location at a distance of 1 mm or less from the outer periphery of the lower surface 10*b* (e.g., when the lower surface 10*b* has a rectangular shape, sides of the rectangular shape forming the outer periphery of the lower surface 10*b*). That is, the shortest distance between the outer periphery of the lower surface 10*b* and the at least one first metal surface 11 can be 1 mm or less. The shortest distance between the outer periphery of the lower surface 10*b* and the at least one first metal surface 11 may be zero, that is, the outer periphery of the lower surface 10*b* and an outer periphery of the at least one first metal surface 11 may correspond to each other.

The at least one first metal surface 11 serves as, for example, at least one terminal of the package 10. A plurality of the first metal surfaces 11 are preferably disposed to serve as terminals of the package 10. Accordingly, the plurality of first metal surfaces 11 can include one or more anode first metal surfaces 11 and one or more cathode first metal surfaces 11. In the package 10 shown in FIG. 2A, anode first metal surfaces 11 are located at a side of the lower surface 10*b* having a rectangular shape, and cathode first metal surfaces 11 are located at an opposite side of the lower surface 10*b*.

The first metal surfaces 11 are made of a material, for example, Au, that can be easily connected to a corresponding one of the at least one first bonding member 30 containing a metal material. The first metal surfaces 11 are, for example, lower surfaces of outer metal layers 16A each disposed at a corresponding surface of an insulating part 17A, which will be described below. As shown in FIG. 2B, an inner metal layer 16B can be disposed at predetermined locations of a recess formed in the insulating part 17A. The inner metal layer 16B at each predetermined location is electrically connected to a laser element 18A via, for example, a corresponding one of wires 18C. The inner metal layer 16B is electrically connected to a corresponding outer metal layer 16A, so that the outer metal layers 16A serve as terminals of the package 10. The outer metal layers 16A can contain one or more of Au, Ni, Ag, Cu, and Ti. With an Au layer located at a lowermost surface of each outer metal layer 16A, the first metal surfaces 11 can be made of Au.

The at least one second metal surface 12 can be located at a central portion of the lower surface 10b. When the first metal surfaces 11 include one or more anode first metal surfaces 11 and one or more cathode first metal surfaces 11, the second metal surface 12 can be disposed between an anode first metal surface 11 and a cathode first metal surface 11. The at least one second metal surface 12 is preferably not a terminal of the package 10. This is because the at least one second bonding member 40, which has a relatively small shape change ratio, is to be connected to the at least one second metal surface 12. That is, an external appearance of the at least one first bonding member 30 can be easily observed due to, for example, formation of a fillet in the step S102 of heating, while the at least one second bonding member 40 wet-spreads less easily than the at least one first bonding member 30, so that external appearance of the at least one second bonding member 40 is not easily observed. Accordingly, it is preferable that the at least one first bonding member 30, an external appearance of which can be easily observed, is used for connection to the at least one terminal of package 10 so that the state of external appearance of the bonding member at the terminal of the package 10 can be observed, while the at least one second bonding member 40, an external appearance of which is not easily observed, is used for connection to components other than the terminal of the package 10.

The at least one second metal surface 12 is, for example, a metal surface for heat-dissipation of, for example, at least one element mounted in the package 10. As shown in FIG. 2B, the at least one element such as the at least one laser element 18A is preferably mounted directly above the second metal surface 12. Such an arrangement allows for reducing a distance between the at least one element to the second metal surface 12, so that heat can be efficiently dissipated. The package 10 may include a heat dissipating body 17B having an upper surface that serves as an element mounting surface and a lower surface that serves as the second metal surface 12. This allows the elements to dissipate heat more efficiently. Examples of a main material of the heat dissipating body 17B include a metal such as Cu. The package 10 may include a plurality of second metal surfaces 12, but when the second metal surface 12 serves as a heat dissipating surface, the package 10 preferably include a single second metal surface 12. When the package 10 includes a single second metal surface 12, the second metal surface 12 tends to be able to have an area larger than an area of each second metal surface 12 when the package 10 includes a plurality of second metal surfaces 12. Further, the greater the area of the second metal surface 12, the more effective for performing heat dissipation. The at least one second metal surface 12 is made of a material that can be easily connected to the at least one second bonding member 40 containing a metal material, such as Au.

As shown in FIG. 2A, the at least one second metal surface 12 can have an area greater than an area of the at least one first metal surface 11. Although it is considered that an effect of the second bonding member 40 in reducing shifts caused by self-alignment can be obtained even when the at least one second metal surface 12 has an area equal to or smaller than an area of the at least one first metal surface 11, with the at least one second metal surface 12 having an area greater than an area of the at least one first metal surface 11, the self-alignment experienced on the package 10 can be further reduced. When the package 10 includes a plurality of first metal surfaces 11 and/or a plurality of second metal surfaces 12, a total area of the at least one first metal surface 11 and a total area of the at least one second metal surface 12 are compared, and the total area of the at least one second metal surface 12 can be greater than the total area of the at least one first metal surface 11. The at least one second metal surface 12 can have an area twice as great as an area (i.e., a total area) of the at least one first metal surface 11 or greater. In view of reducing a size of the package 10, the at least one second metal surface 12 can have an area five times as great as an area (i.e., a total area) of the at least one first metal surface 11 or less. At the lower surface 10b of the package 10, the first and second bonding members 30 and 40, which are to be deformed in the step S102 of heating, can be connected to only the at least one first metal surface 11 and the at least one second metal surface 12.

The package 10 can be a laser package in which the at least one laser element 18A is disposed. In this case, alignment of the package 10 with respect to the mounting substrate 20 is preferably performed, while driving the at least one laser element 18A, based on a position of light emitted from the at least one laser element 18A and/or a direction of polarized light, rather than based on a shape of the package 10. This is because, when the package 10 is a laser package, position of emission and the like tend to be varied according to a mounting position and the like of the at least one laser element 18A, rather than a shape of the package 10. Alignment of position of emission in the package 10 with respect to the mounting substrate 20 allows for facilitating combination with a lens or the like based on a shape of the mounting substrate 20. Further, for driving the at least one laser element 18A, aligning the package 10 with respect to the mounting substrate 20 based on the emission position in the package 10, and securing the package 10 with bonding members, it is preferable that self-alignment effect of the bonding member does not easily occur. Accordingly, particularly in the case in which the package 10 is a laser package, it is preferable to use the second bonding member 40 to obtain a bonding state in which self-alignment does not easily occur.

The package 10 can include at least one laser element 18A, for example, three laser elements 18A These laser elements 18A may emit light of the same color, or different colors. For example, the package 10 may include three laser elements 18A including a first laser element to emit red laser light, a second laser element to emit green laser light, and a third laser element to emit blue laser light. The red laser light has a peak emission wavelength, for example, in a range of 605 nm to 750 nm. Examples of such a laser element include a semiconductor laser element containing an InAlGaP-based semiconductor, a GaInP-based semiconductor, a GaAs-based semiconductor, or AlGaAs-based semiconductor. The green laser light has a peak emission wavelength, for example, in a range of 495 nm to 570 nm. The blue laser light has a peak emission wavelength, for example, in a range of 420 nm to 494 nm. Examples of the laser element to emit green laser light and the laser element to emit blue laser light include semiconductor laser elements containing nitride semiconductors. Examples of the nitride semiconductors include GaN, InGaN, and AlGaN. The at least one laser element 18A can be arranged on the element-mounting surface via at least one of submounts 18B. The package 10 may further include a light-reflecting member that upwardly reflects light emitted from the at least one laser element 18A.

As shown in FIG. 2C, the package 10 may further include at least one third metal surface 13, each of which is connected to a corresponding first metal surface 11, at lateral surfaces of the package 10. With the at least one third metal surface 13, the at least one first bonding member 30 heated in the step S102 of heating can creep up the at least one third metal surface 13. Accordingly, the bonding state of the at least one first bonding member 30 after the step S102 of heating can be easily observed. As shown in FIG. 2C, three third metal surfaces 13 may be formed in each single lateral surface of the package 10. The third metal surface 13 at a central region of each of the lateral surfaces can have a width greater than a width of each of two third metal surfaces 13 at two opposite ends of each lateral surface of the package 10. For example, the at least one third metal surface 13 can have a length that allows the third metal surface 13 to connect the lower surface 10b and the upper surface 10a. The at least one third metal surface 13 may have a length that allows an upper edge of the third metal surface 13 to be located lower than the upper surface 10a.

The package 10 can further include the insulating part 17A. Examples of a material of the insulating part 17A include a resin and a ceramic. When the at least one laser element 18A is mounted on the package 10, if a resin is used for the insulating part 17A, the resin may be deteriorated by laser light, so that a ceramic is preferably used for the insulating part 17A. Examples of a ceramic include $Al_2O_3$ ceramics and AlN ceramics. When a ceramic is used for the insulating part 17A, for example, at least one recess is formed at lateral surfaces of the insulating part 17A, and the at least one third metal surface 13 is formed on a surface of the at least one recess. The number of the third metal surface 13 may not be the same as the number of the first metal surface 11. For example, the third metal surfaces 13 may be formed only on four corners of the insulating part 17A.

The package 10 can further include a cover 19. A space surrounded by the insulating part 17A and the cover 19 is preferably sealed airtight. Such airtight sealing of the at least one laser element 18A can prevent collection of organic dust at an emission end surface of the at least one laser element 18A. For example, a glass provided with a metal film, or a sapphire provided with a metal film can be used for the cover 19.

As shown in FIG. 3A and FIG. 3B, the mounting substrate 20 includes an upper surface 20a and a lower surface 20b, and includes at least one first metal pattern 21 and at least one second metal pattern 22 that are disposed at the upper surface 20a. The mounting substrate 20 can further include an insulating part 29 having a surface on which the at least one first metal pattern 21 and the at least one second metal pattern 22 are disposed. The mounting substrate 20 may further include a metal part 28 below the insulating part 29.

As shown in FIG. 3A, the at least one second metal pattern 22 can have an area larger than an area of the at least one first metal pattern 21. Although it is considered that an effect of the second bonding member 40 in reducing shifts caused by self-alignment can be obtained even when the at least one second metal pattern 22 has an area equal to or smaller than an area of the at least one first metal pattern 21, with the at least one second metal pattern 22 having an area greater than an area of the at least one first metal pattern 11, the self-alignment effect experienced on the package 10 can be further reduced. When the package 10 includes a plurality of first metal patterns 21 and/or a plurality of second metal patterns 22, a total area of the at least one first metal pattern 21 and a total area of the at least one second metal pattern 22 are compared, and the total area of the at least one second metal pattern 22 can be greater than the total area of the at least one first metal pattern 21. The at least one second metal pattern 22 can have an area twice as great as an area (i.e., a total area) of the at least one first metal pattern 21 or greater. In view of reduction in size of the mounting substrate 20, the at least one second metal pattern 22 can have an area five times as great as an area (i.e., a total area) of the at least one first metal pattern 21 or less. At the upper surface 20a of the mounting substrate 20, the first and second bonding members 30 and 40, which are to be deformed in the step S102 of heating, can be connected to only the at least one first metal pattern 21 and the at least one second metal pattern 22.

Examples of a material used for the at least one first metal pattern 21 and the at least one second metal pattern 22 include Au, Ni, Ag, Cu, and Ti. A surface of the at least one first metal pattern 21 and a surface of the at least one second metal pattern 22 can be made of a material appropriate for connection to the at least one first bonding member 30 and the at least one second bonding member 40, respectively, such as Au. When the first metal surface 11 is a terminal of the package 10, the mounting substrate 20 can include at least one electrode 23 electrically connected to the at least one first metal pattern 21. As shown in FIG. 3B, at least one metal layer 24 can be disposed on the insulating part 29. The at least one metal layer 24 may be disposed above the insulating part 29. A portion of each metal layer 24 can serve as the first metal pattern 21, and another portion of each metal layer 24 can serve as the electrode 23. In this case, at least one insulating film 25 can cover a region between each first metal pattern 21 and a respective electrode 23, so that wet-spread of the at least one first bonding member 30 toward the at least one electrode 23 can be prevented in the step S102 of heating. For the at least one metal layer 24, a material similar to that of the first metal pattern 21 can be used.

For the metal part 28, Cu, Al, Cu alloy, Al alloy, or the like can be used. For the insulating part 29, $SiO_2$, a resin, an inorganic filler, solder resist, or the like can be used, or a ceramic such as $Al_2O_3$ or AlN may be used. In order to improve heat dissipation, the mounting substrate 20 preferably includes the metal part 28. When using $Al_2O_3$, AlN, or an insulating member such as glass epoxy instead of the metal part 28, the insulating part 29 may be omitted.

As shown in FIG. 4, the mounting substrate 20 is disposed below the package 10. The at least one first metal pattern 21 is located below the at least one first metal surface 11. The at least one second metal pattern 22 is located below the at least one second metal surface 12. In the present specification, the expression "below" refers to a direction from the package 10 toward the mounting substrate 20. The at least one first bonding member 30 contains a metal material, and is disposed at a position connecting the at least one first metal surface 11 and the at least one first metal pattern 21. The at least one second bonding members 40 contains a metal material, and is disposed at a position connecting the at least one second metal surface 12 and the at least one second metal pattern 22.

As will be described below, a material of the at least one first bonding member 30 and a material of the at least one second bonding member 40 are selected so that a shape change ratio of the second bonding member 40 between before the step S102 of heating and after the step S102 of heating is smaller than a shape change ratio of the first bonding members 30 between before the step S102 of heating and after the step S102 of heating. For the at least one first bonding member 30, a bonding member containing a metal material can be used. Examples of the metal material include alloy materials such as Sn—Ag—Cu. Examples of the first bonding members 30 include a solder containing the metal material and flux.

For the at least one second bonding member 40, a bonding member using transient liquid phase sintering (TLPS) can be used. The at least one second bonding member 40 contains, for example, a low melting-point metal and a high melting-point metal having a melting point higher than a melting point of the low melting-point metal. The low melting-point metal and the high melting-point metal can be transient-liquid-phase-sintered in the step S102 of heating. For the second bonding member 40, instead of the bonding member using TLPS, for example, a paste in which metal particles such as Au or Ag are contained in an organic solvent may be used. When using such a paste, a portion or an entirety of the organic solvent is evaporated in the step S102 of heating, so that the paste will become the second bonding member 40 mainly made of a metal after the step S102 of heating.

It is preferable that the at least one first bonding member 30 is not a bonding member using TLPS. The bonding member using TLPS is not easily deformed by heating, and thus is not appropriate to be used for confirming the bonding state by observing external appearance thereof. Also, a bonding member that does not contain a metal material may be used for the at least one first bonding member 30 and the at least one second bonding member 40, but when the at least one first metal surface 11 is a terminal, an electrically conductive bonding member is used for at least the at least one first bonding member 30. Further, when the at least one second metal surface 12 serves as a heat-dissipating surface, a bonding member containing a metal material is preferably used for the at least one second bonding member 40.

In the case of disposing a plurality of first bonding members 30, the plurality of first bonding members 30 may not all be made of the same material. When all of the plurality of first bonding members 30 are made of the same material, the plurality of first bonding members 30 can be formed collectively without changing formation devices. Also, when forming a plurality of second bonding members 40, the plurality of second bonding members 40 may not all be made of the same material, or may all be made of the same material. When all of the plurality of second bonding members 40 are made of the same material, the plurality of second bonding members 40 can be collectively formed. In addition to the at least one first bonding member 30 and the at least one second bonding member 40, an additional bonding member may be further used. The position and amount of the additional bonding member is adjusted so that an effect of the at least one second bonding member 40 in reducing shifts caused by self-alignment can be obtained.

For example, the at least one first bonding member 30 is disposed on a corresponding one of the at least one first metal pattern 21 of the mounting substrate 20, and the at least one second bonding member 40 is disposed on a corresponding one of the at least one second metal pattern 22 of the mounting substrate 20. Even if the at least one first bonding member 30 has a great thickness when formed, the thickness of the at least one first bonding member 30 can be easily reduced due to easiness in deformation. Meanwhile, the second bonding member 40 is less easily deformed than the first bonding members 30. Thus, when forming the first and second bonding members 30 and 40, the second bonding member 40 is preferably formed to have a thickness smaller than a thickness of the first bonding members 30. Accordingly, the second bonding member 40 after the step S102 of heating can have a relatively reduced thickness, so that heat generated in the package 10 can be more effectively transmitted to the mounting substrate 20. The at least one first bonding member 30 can be formed on the at least one first metal pattern 21 using, for example, a dispenser. When a bonding member using TLPS is used for the at least one second bonding member 40, the second bonding member 40 can be formed on the at least one second metal pattern 22 by screen printing. Accordingly, the at least one second bonding member 40 after the step S102 of heating can have a thickness smaller than that in the case of applying the at least one second bonding member 40 using a dispenser. The at least one first bonding member 30 and/or the at least one second bonding member 40 can be formed on the at least one first metal surface 11 and/or the at least one second metal surface 12, respectively, of the package 10, instead of the mounting substrate 20.

Step S102 of Heating

Figure 5:
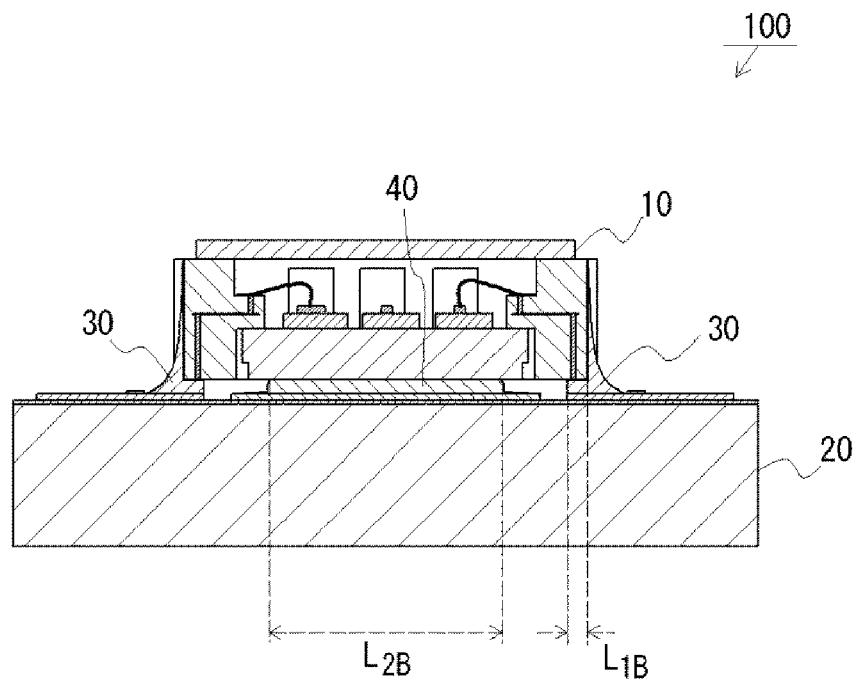
FIG. 5 is a schematic cross-sectional view of the semiconductor device according to the first embodiment.

In the step S102 of heating, the at least one first bonding member 30 and the at least one second bonding member 40 are heated at a temperature equal to or higher than both a bonding temperature of the at least one first bonding member 30 and a bonding temperature of the at least one second bonding member 40. Accordingly, the package 10 and the mounting substrate 20 are bonded together via the at least one first bonding member 30 and the at least one second bonding member 40. Thus, a semiconductor device 100 as shown in FIG. 5 can be obtained. FIG. 5 is a schematic cross-sectional view of the semiconductor device 100 after the step S102 of heating.

As shown in FIG. 4 and FIG. 5, a shape change ratio of the at least one second bonding member 40 between before and after the step S102 of heating is smaller than a shape change ratio of the at least one first bonding member 30 between before and after the step S102 of heating. That is, the at least one first bonding member 30 has a substantially quadrangular cross-sectional shape before the step S102 of heating, but after the step S102 of heating, each first bonding member 30 wet-spreads over substantially an entirety of a corresponding first metal surface 11 and substantially an entirety of a corresponding first metal pattern 21, forming a fillet that extends from an outer periphery of the corresponding first metal pattern 21 via an outer periphery of the corresponding first metal surface 11 to a corresponding third metal surface 13. Meanwhile, the at least one second bonding member 40 has a substantially quadrangular cross-sectional shape before the step S102 of heating as in the at least one first bonding member 30, but a shape of an entirety of the at least one second bonding member 40 is not changed after the step S102 of heating, not as in the at least one first bonding member 30. After the step S102 of heating, a portion of the at least one second bonding member 40 wet-spreads to the at least one second metal pattern 22, while a main portion of the at least one second bonding member 40 maintains the substantially quadrangular cross-sectional shape.

A shape change ratio of the at least one first bonding member 30 can be represented by a ratio of change in a length of a portion of each first bonding member 30 connecting a corresponding first metal pattern 21 and a corresponding first metal surface 11 at the shortest distance between the corresponding first metal pattern 21 and the corresponding first metal surface 11, in cross-sectional views such as shown in FIG. 4 and FIG. 5. The term "length," as used herein, refers to a length in a direction parallel to the at least one first metal surface 11. The length of such a portion of the first bonding member 30 is indicated by "Lia" in FIG. 4, and is indicated by "$L_{1B}$" in FIG. 5. A shape change ratio of the at least one first bonding member 30 can be represented by $(L_{1B}-L_{1A})/L_{1A}$. In similar manner, a shape change ratio of the at least one second bonding member 40 can be represented by a ratio of change in a length of a portion of each second bonding member 40 connecting a corresponding second metal pattern 22 and a corresponding second metal surface 12 at the shortest distance between the corresponding second metal pattern 22 and the corresponding second metal surface 12, in cross-sectional views such as shown in FIG. 4 and FIG. 5. The length of such a portion of the second bonding member 40 is indicated by "$L_{2A}$" in FIG. 4, and is indicated by "$L_{2B}$" in FIG. 5A. A shape change ratio of the at least one second bonding member 40 can be represented by $(L_{2B}-L_{2A})/L_{2A}$. For example, in FIG. 5, a portion of the at least one second bonding member 40 wet-spreads to a surface of the second metal pattern 22, while a main portion of the second bonding member 40 maintains the substantially quadrangular cross-sectional shape. Calculating a shape change ratio, where a length of a portion of the second bonding member 40 other than the wet-spread portion is represented as $L_{2A}$, allows for evaluating whether or not the second bonding member 40 maintains substantially the original shape. When including a plurality of first bonding members 30 and/or a plurality of second bonding members 40, the average value of the shape change ratios of the plurality of first bonding members 30 and the average value of the shape change ratios of the plurality of second bonding members 40 can be compared.

Using the at least one first bonding member 30 and the at least one second bonding member 40 with such structures allows for both observing a bonding state and performing alignment between a package 10 and a mounting substrate 20 irrespective of shapes of metal surfaces or the like. That is, each first bonding member 30 wet-spreads to a corresponding first metal surface 11 and a corresponding first metal pattern 21, for example, to form a fillet. Accordingly, the bonding state of the at least one first bonding member 30 can be confirmed by observing external appearance of the at least one first bonding member 30. Further, with the at least one second bonding member 40 having a small shape change ratio, self-alignment effect does not easily occur at the at least one second bonding member 40. Accordingly, alignment between the package 10 and the mounting substrate 20 can be performed irrespective of a shape of the at least one first metal surface 11, a shape of the at least one second metal surface 12, a shape of the at least one first metal pattern 21, and a shape of the at least one second metal pattern 22.

When the at least one first bonding member 30 contains an alloy material, heating in the step S102 of heating is performed at a temperature equal to or higher than a melting point of the alloy material. When the at least one first bonding member 30 is a solder, the phrase "bonding temperature of the at least one first bonding member 30," as used herein, refers to a melting temperature of the solder. A melting temperature of a solder is, for example, approximately in a range of 200° C. to 230° C. When the at least one second bonding member 40 is a bonding member using TLPS, the phrase "bonding temperature of the at least one second bonding member 40," as used herein, refers to a sintering temperature of the bonding member using TLPS. For example, the at least one second bonding member 40 contains the low melting-point metal and the high melting-point metal, and, in the step S102 of heating, the at least one second bonding member 40 is heated at a temperature equal to or higher than a melting point of the low melting-point metal. Accordingly, the low melting-point metal and the high melting-point metal are transient-liquid-phase-sintered. Heating in the step S102 of heating can be performed at a heating temperature of, for example, 230° C. or higher. The heating temperature in the step S102 of heating is preferably lower than a temperature at which bonding strength at bonding portions other than the at least one first bonding member 30 and the at least one second bonding member 40 are reduced, such as a melting temperature of an adhesive material for securing the at least one laser element 18A to the at least one submount 18B. Accordingly, deviation in positions of members bonded to such bonding portions can be reduced. The heating temperature is, for example, 300° C. or less. The term "heating temperature," as used herein, refers to, for example, a temperature of a stage of a reflow furnace on which the mounting substrate 20 is placed.

Semiconductor Device 100

As shown in FIG. 5, the semiconductor device 100 includes, the package 10, the mounting substrate 20, the at least one first bonding member 30, and the at least one second bonding member 40. The package 10 includes the at least one first metal surface 11 and the at least one second metal surface 12. The mounting substrate 20 is disposed below the package 10. The mounting substrate 20 includes the at least one first metal pattern 21 located below the at least one first metal surface 11, and the at least one second metal pattern 22 located below the at least one second metal surface 12.

The at least one first bonding member 30 bonds the at least one first metal surface 11 and the at least one third metal surface 13 to the at least one first metal pattern 21. The at least one first bonding member 30 forms a fillet extending from an outer periphery of a corresponding third metal surface 13 to an outer periphery of the at least one first metal pattern 21. The at least one second bonding member 40 bonds the at least one second metal surface 12 and the at least one second metal pattern 22 together, and has a shape different from a shape of the at least one first bonding member 30. In other words, the at least one second bonding member 40 has a shape without a fillet. More specifically, the at least one second bonding member 40 includes a main portion having an area smaller than an area of a corresponding second metal pattern 22 in a top view, and a wet-spread portion spreading from the main portion toward the outer periphery of the corresponding second metal pattern 22. A single package 10 is disposed on a single mounting substrate 20 in FIG. 5, but a plurality of packages 10 may be disposed. The plurality of packages 10 may emit light of the same color or different colors.

Figure 6:
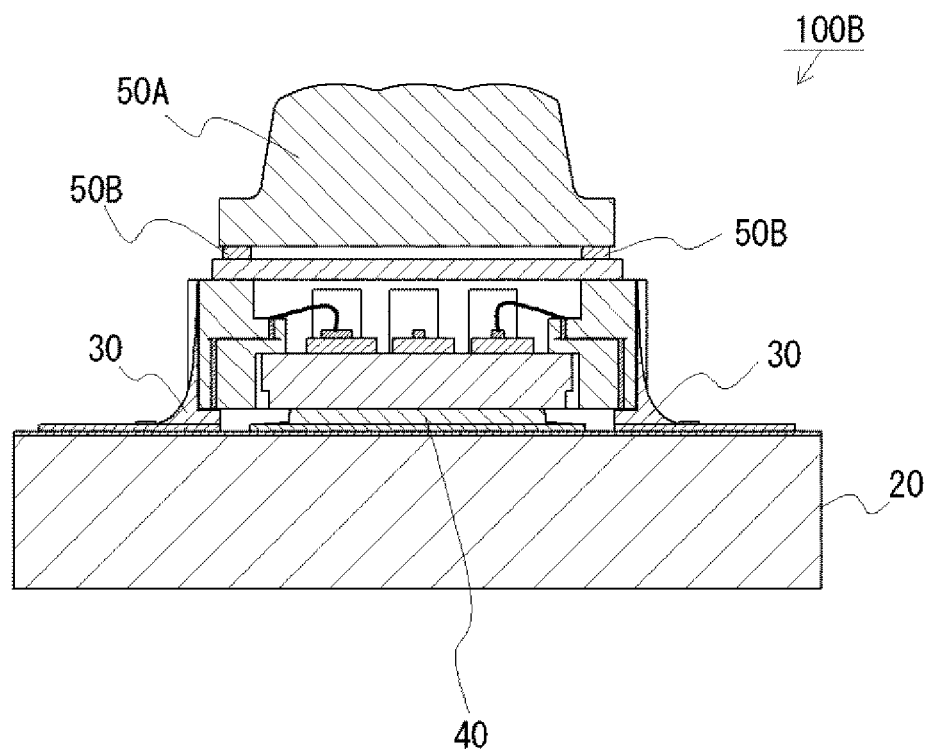
FIG. 6 is a schematic cross-sectional view of a modified example of the semiconductor device.

FIG. 6 is a schematic cross-sectional view of a modified example of the semiconductor device. As shown in FIG. 6, a semiconductor device 100B according to the modified example may further include a lens 50A. With the lens 50A, light emitted from the at least one laser element 18A can be collimated, condensed, or diffused. The semiconductor device 100B is similar to the semiconductor device 100 except for including the lens 50A and an adhesive agent 50B. The lens 50A is secured on the cover 19 of the package 10 via the adhesive agent 50B such as a resin. The lens 50A has a function of collimating light emitted from the at least one laser element 18A. For the lens 50A, a lens that condense or diffuse light emitted from the at least one laser element 18A can be used. The lens 50A may be secured on the package 10 before the step S102 of heating, but in the case of securing the lens 50A on the package 10 after the step S102 of heating, deviation in position of the lens 50A due to, for example, decrease in adhesive strength caused in the step S102 of heating does not easily occur, and thus the lens 50A is preferably secured on the package 10 after the step S102 of heating.

Figure 7:
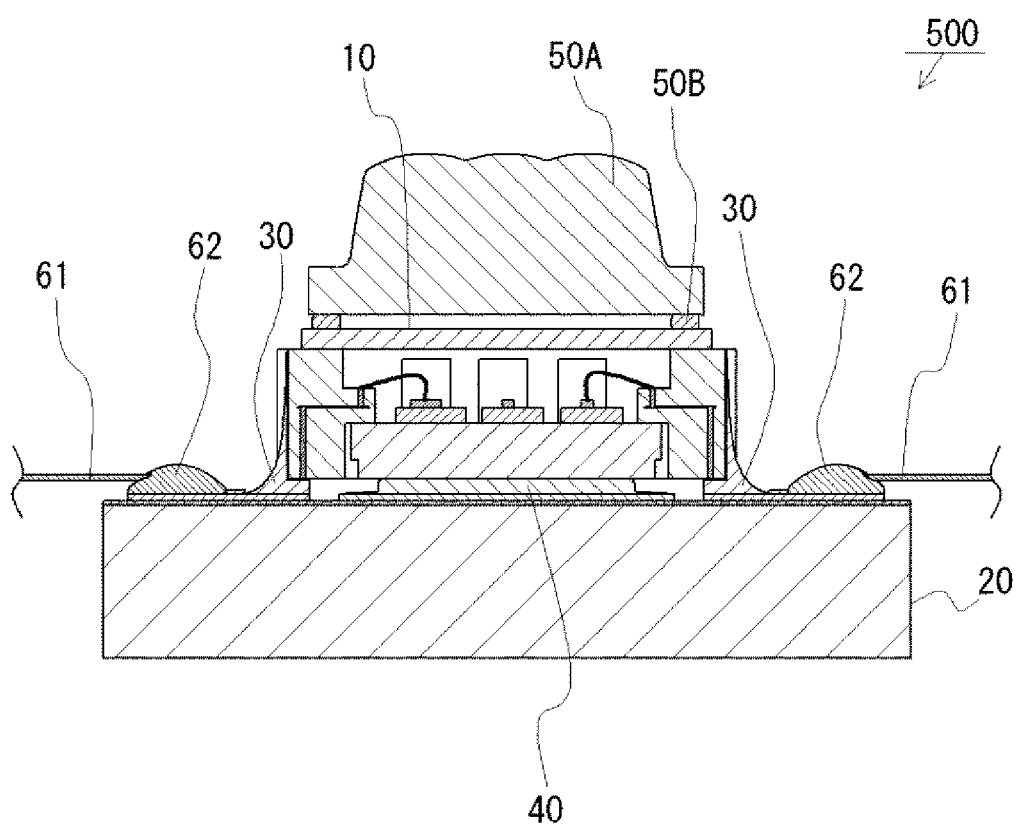
FIG. 7 is a schematic cross-sectional view of a semiconductor module.

FIG. 7 is a schematic cross-sectional view of a semiconductor module 500 including the semiconductor device 100. In the semiconductor module 500, each electrode 23 of the semiconductor device 100 is connected to a respective one of conducting terminals 61 via a respective one of bonding members 62. The conducting terminals 61 are electrically connected to external power sources. When the at least one second bonding member 40 is a bonding member using TLPS, an intermetallic compound having a melting point higher than a sintering temperature of the bonding member using TLPS is formed in the step S102 of heating. Accordingly, a material having a bonding temperature lower than a re-melting temperature of the at least one second bonding member 40 can be used for the bonding members 62. This allows for obtaining an advantage that a position of the package 10 with respect to the mounting substrate 20 is not easily shifted when the semiconductor device 100 is heated to a bonding temperature of the bonding members 62. Securing each of the conducting terminals 61 using a respective one of the bonding members 62 allows for connecting each conducting terminal 61 and a respective electrode 23 more securely than in the case in which the bonding members 62 are not used. For example, when the conducting terminal 61 is separated from a corresponding electrode 23 due to vibration, supply of electricity to the package 10 may be stopped. However, using the bonding members 62 allows for reducing possibility of stopping supply of electricity. Examples of the bonding members 62 include a solder containing an alloy material described above as an example of the at least one first bonding member 30. The at least one second bonding member 40 after the step S102 of heating has a re-melting temperature, for example, higher than 400° C.

Experimental Example

In an Experimental Example, pseudo packages, which were similar to the packages 10 shown in FIG. 2A to FIG. 2C except without the at least one laser element 18A, the submounts 18B, wires 18C, and the cover 19, were provided. Each pseudo package was bonded to a mounting substrate 20 as shown in FIG. 3A and FIG. 3B via first bonding members 30 and second bonding members 40. Each of the first bonding members 30 was disposed at a position connecting a corresponding first metal surface 11 and a corresponding first metal pattern 21. The second bonding member 40 was disposed at a position connecting the second metal surface 12 and the second metal pattern 22. For the first bonding members 30, a solder containing Sn—Ag—Cu alloy was used. For the second bonding member 40, a paste using TLPS was used.

Comparative Example

In a Comparative Example, pseudo packages were bonded to the mounting substrate 20 in a manner similar to the manner in the Experimental Example except that the first bonding member 30 was disposed instead of the second bonding member 40 at a position connecting the second metal surface 12 and the second metal pattern 22.

Experimental Results

In the Experimental Example and the Comparative Example, five pseudo packages and their respective five mounting substrates 20 were bonded, a bonding state of the first bonding members 30 after heating was observed, and an amount of shift in position of each of the pseudo packages between before and after heating was measured. The bonding state of the first bonding members 30 could be observed in both the Experimental Example and the Comparative Example. That is, in both the Experimental Example and the Comparative Example, during observation of external appearance after heating, the first bonding members 30 creeping up the third metal surfaces 13 was confirmed. As a result of measurement of amounts of shifts in position of the pseudo packages between before and after heating, the average value of amounts of shifts of the pseudo packages are shown in TABLE 1.

TABLE 1

|  | Shift in an x-axis direction (μm) | Shift in a y-axis direction (μm) | Rotation angle (degree) |
| --- | --- | --- | --- |
| Experiment Example | 1.8 | 2.6 | 0.01 |
| Comparative Example | 63.6 | 40.3 | 0.29 |

The phrase "shift in an x-axis direction," as used herein, refers to a shift in a lateral direction in FIG. 3A, and the phrase "shift in a y-axis direction," as used herein, refers to a shift in an upper-lower direction in FIG. 3A. The term "rotation angle," as used herein, refers to an angle in a top view at which the pseudo packages were rotated. Each amount of shift in the x-axis direction and each amount of shift in the x-axis direction were obtained by measuring displacement of the middle point of an imaginary line connecting two markers formed on each package 10 in a respective mounting substrate 20. Each rotation angle was obtained by measuring rotation angle of the imaginary line connecting the two markers formed on each package 10 in the mounting substrate 20. Ratios of reduction in shift of the Experiment Example to the Comparative Example were approximately 97.2% in the x-axis direction, approximately 93.5% in the y-axis direction, and 96.6% in the rotation angle. As described above, it was confirmed that amounts of shifts in position in the Experimental Example was reduced compared to in the Comparative Example. In the Comparative Example, when amounts of deviation in position of the midpoint of the imaginary line connecting the two markers on the package 10 from a designed position, an average value of deviations in position in the x-axis direction was 7.6 μm, an average value of deviations in position in the y-axis direction was 10.8 μm, and average value of the rotation angles was 0.13 degree. Therefore, self-alignment may cause deviation in position of the package 10 from a designed position. Accordingly, it can be considered that alignment can be performed more accurately when using the second bonding member 40 with a small shape change ratio as in the Experiment Example, instead of relying on self-alignment.

The semiconductor device described in certain embodiments can be used for projectors, headlights on vehicles, illuminations, backlight devices for display devices, etc.

It is to be understood that although certain embodiments of the present invention have been described, various other embodiments and variants may occur to those skilled in the art that are within the scope and spirit of the invention, and such other embodiments and variants are intended to be covered by the following claims.

What is claimed is:

1. A semiconductor device comprising:
   a package comprising:
      a lower surface,
      at least one first metal surface at an outer periphery of the lower surface, and
      at least one second metal surface at the lower surface at a location different from the at least one first metal surface;
   a mounting substrate disposed below the package and comprising:
      an upper surface,
      at least one first metal pattern disposed at the upper surface below the at least one first metal surface, and
      at least one second metal pattern disposed at the upper surface below the at least one second metal surface;
   at least one first bonding member containing a metal material and bonding the at least one first metal surface and the at least one first metal pattern; and
   at least one second bonding member containing a metal material and bonding the at least one second metal surface and the at least one second metal pattern;
   wherein a shape of the at least one second bonding member is different from a shape of the at least one first bonding member; and
   wherein a material from which the at least one first bonding member is formed is different than a material from which the at least one second bonding member is formed.

2. The semiconductor device according to claim 1, wherein the at least one first bonding member contains an alloy material.

3. The semiconductor device according to claim 1, wherein an area of the at least one second metal surface is greater than an area of the at least one first metal surface.

4. The semiconductor device according to claim 1, wherein an area of the at least one second metal pattern is greater than an area of the at least one first metal pattern.

5. The semiconductor device according to claim 1, wherein the at least one first metal surface forms at least one terminal of the package.

6. The semiconductor device according to claim 1, wherein the at least one first bonding member forms a fillet connecting at least an outer periphery of the at least one first metal surface and an outer periphery of the at least one first metal pattern.

7. The semiconductor device according to claim 1, wherein the at least one second bonding member includes a main portion having an area smaller than an area of the at least one second metal pattern in a top view, and a wet-spread portion spreading from the main portion toward an outer periphery of the at least one second metal pattern.

8. The semiconductor device according to claim 1, wherein the at least one second bonding member contains a low melting-point metal and a high melting-point metal having a melting point higher than a melting point of the low melting-point metal.

9. The semiconductor device according to claim 1, further comprising at least one laser element disposed in the package.

10. The semiconductor device according to claim 9, wherein the package comprises a cover.

11. The semiconductor device according to claim 10, wherein the package comprises an insulating part, and wherein a space surrounded by the insulating part and the cover is sealed airtight.

12. The semiconductor device according to claim 1, further comprising an insulating film disposed on the mounting substrate.

13. The semiconductor device according to claim 12, further comprising an electrode disposed on the mounting substrate.

14. The semiconductor device according to claim 13, wherein the insulating film covers a region between the at least one first metal pattern and the electrode.

* * * * *